(12) United States Patent
Yamashita et al.

(10) Patent No.: US 7,939,998 B2
(45) Date of Patent: May 10, 2011

(54) DISPLAY APPARATUS

(75) Inventors: Takanori Yamashita, Chiba (JP);
Masami Iseki, Mobara (JP); Tatsuhito Goden, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 150 days.

(21) Appl. No.: 12/465,228

(22) Filed: May 13, 2009

(65) Prior Publication Data

US 2009/0284147 A1     Nov. 19, 2009

(30) Foreign Application Priority Data

May 16, 2008 (JP) ................................. 2008-129583
Mar. 24, 2009 (JP) ................................. 2009-071998

(51) Int. Cl.
*H01L 51/50* (2006.01)

(52) U.S. Cl. ........................................ 313/498; 313/506
(58) Field of Classification Search ........... 313/498–512
See application file for complete search history.

(56) References Cited

U.S. PATENT DOCUMENTS 7,221,095 B2 *   5/2007   Yamazaki et al. ............ 313/509

FOREIGN PATENT DOCUMENTS

JP     2003-316291 A     11/2003

* cited by examiner

*Primary Examiner* — Anne M Hines
(74) *Attorney, Agent, or Firm* — Canon USA Inc IP Division (57) ABSTRACT

A display apparatus includes a first wiring disposed on one side of a periphery of a display part, a second wiring connecting a terminal to the first wiring, and a third wiring disposed in the display part. The third wiring extends between the one side where the terminal is located and an opposite side. The third wiring is connected to the first wiring. The first, second, and third wirings have resistances per unit length, $R_1$, $R_2$, and $R_3$, respectively, which are set such that $R_2 < R_1 < R_3$.

10 Claims, 7 Drawing Sheets

DISPLAY APPARATUS

BACKGROUND OF THE INVENTION

1. Field of the Invention

The present invention relates to a display apparatus including light emitting elements disposed in a display part.

2. Description of the Related Art

In recent years, much attention has been paid to an active matrix organic EL display apparatus including EL elements arranged in a matrix form on a substrate having TFTs (Thin Film Transistors).

For example, Japanese Patent Laid-Open No. 2003-316291 discloses one such apparatus, in which a second electrode is formed with a transparent electroconductive film across the whole surface on a light emission side of an image display part. When the transparent electroconductive film is formed to have a thickness of about 100 nm, it has a sheet resistance as high 100Ω/☐ or greater, and thus power consumption occurs due to the high resistance of the transparent electroconductive film. To compensate for the power consumption, a first auxiliary wiring is disposed in the image display part. The first auxiliary wiring is connected to a second auxiliary wiring extending in a direction crossing the first auxiliary wiring. The second auxiliary wiring is connected via a contact hole to a wiring disposed in a periphery of a light emitting apparatus. The wiring extends around the light emitting apparatus and is connected to an input/output terminal (see FIGS. 2 to 4 in Japanese Patent Laid-Open No. 2003-316291).

In the technique disclosed in Japanese Patent Laid-Open No. 2003-316291, by providing the first auxiliary wiring, the second auxiliary wiring, and the wiring, a reduction is achieved in voltage difference across a second electrode plane. The wirings described above are formed using a material having lower resistance than that of the second electrode. This can cause a current to concentrate on the wirings. In the wirings disposed between the second electrode and the terminal (input/output terminal), the current concentration increases with position toward the terminal. More specifically, the current concentration increases in order of the first auxiliary wiring, the second auxiliary wiring, the wiring. In parts where the current concentration occurs, the wiring has relatively greater heat generation. Thus, greater heat generation occurs locally in a part close to the terminal than in the other parts in the light emitting apparatus. That is, heat generation increases in order of the first auxiliary wiring, the second auxiliary wiring, the wiring.

If there is a local part having high heat generation, influence of heat generation on light emitting elements disposed in the display part varies from one light emitting element to another, and thus nonuniformity occurs in characteristics of the light emitting elements across the display part. The influence of heat generation on light emitting elements is significantly great, in particular, when organic EL elements are used as the light emitting elements.

SUMMARY OF THE INVENTION

The present invention provides a display apparatus having small potential difference in a plane of an electrode provided in common for a plurality of light emitting elements and having uniformity in terms of heat generation on a plurality of wirings disposed between a terminal and the common electrode for the plurality of light emitting elements.

More specifically, the present invention provides a display apparatus including a substrate, and a display part disposed on the substrate, wherein the display part includes a plurality of light emitting elements and the plurality of light emitting elements each include a first electrode, a light emitting layer, and a second electrode that are formed on the substrate in order from bottom to top of the first electrode, the light emitting layer, and the second electrode. The display apparatus further includes a terminal disposed on one side of a periphery of the display part, a first wiring disposed on the one side in the periphery of the display part, a second wiring connecting the terminal to the first wiring, a third wiring disposed in the display part, the third wiring extending between the one side and an opposite side, the third wiring being connected to the first wiring, wherein the second electrode is connected to the third wiring and wherein the first, second, and third wirings have resistances per unit length, $R_1$, $R_2$, and $R_3$, respectively, which are set such that $R_2 < R_1 < R_3$.

The display apparatus according to the present invention has the advantage of uniformity achieved in terms of the heat generation on the plurality of wirings connected between the terminal and the electrode provided in common for the plurality of light emitting elements.

Further features of the present invention will become apparent from the following description of exemplary embodiments with reference to the attached drawings.

DESCRIPTION OF THE EMBODIMENTS

According to an embodiment of the present invention, there is provided a display apparatus including a substrate, a display part disposed on the substrate and including a plurality of light emitting elements, a terminal disposed on one side of a periphery of the display part, and first, second, and third wirings connecting the light emitting elements constituting the display part to the terminal. The first wiring is a wiring disposed on one side of the periphery of the display part. The second wiring is a wiring connecting the terminal to the first wiring. The third wiring is a wiring disposed in the display part so as to extend between the one side and a side opposite to the one side and so as to be connected to the first wiring. Note that the third wiring extends between adjacent light emitting elements in the display part 1. The display part is a part configured to display image information using a plurality of light emitting elements formed therein. Also note that the display part may include additional elements having no contribution to displaying the image information. Still note that the periphery of the display part denotes a peripheral area (frame area) of the display apparatus, which is outside the display part.

Each light emitting element formed in the display part includes a thin film transistor disposed on the substrate, a first electrode connected to the thin film transistor, a light emitting layer formed on the first electrode, and a second electrode formed on the light emitting layer.

Note that one first electrode is disposed independently for each light emitting element so that a different current depending on each light emitting element is supplied thereto. On the other hand, the second electrode is formed in common for all light emitting elements. More specifically, the second electrode is formed continuously over all light emitting elements and extends across spaces between adjacent light emitting elements. The second electrode is connected to the third wiring. The second electrode is designed to be equal in potential for all light emitting elements. However, in practice, the electric resistance of the second electrode creates a potential difference between the center of the display part and a peripheral part thereof. To reduce the potential difference, there are provided first, second, and third wirings that connect the terminal and the second electrode of each light emitting element.

In the display apparatus according to the present invention, the resistance values $R_1$, $R_2$, and $R_3$ per unit length of the first, second, and third wirings are set such that $R_2 < R_1 < R_3$. In the present invention, the term "length" refers to a length as measured in a direction in which a current flows. Note that the direction in which the current flows depends on the specific wiring. More specifically, the length of the first wiring is defined in a direction along a side on which the terminals are located in the periphery of the display part. In a case where the second wiring is formed to simply extend linearly, the length thereof is defined in a direction extending between the first wiring and the terminal. In a case where the second wiring is disposed in a bent form, the length is defined for each linear segment of the second wiring in a direction in which a current flows in the segment. In the second wiring, if the resistance per unit length varies depending on the position on the second wiring, the resistance per unit length is given by the mean resistance value taken over the whole length. The length of the third wiring is defined in a direction from one side of the display part toward the opposite side thereof. In a case where there are a plurality of third wirings, the resistance per unit length is given by the value per one wiring.

In the present invention, by varying the resistance per unit length for the respective wirings depending on the currents flowing through the wirings, an improvement is achieved in terms of uniformity of heat generation on the plurality of wirings extending between the terminal and the common electrode of the plurality of light emitting elements. This makes it possible to achieve an improvement in uniformity of influence of heat generation on the light emitting elements and thus it becomes possible to achieve good uniformity in displaying image information across the display part for a long period.

The display apparatus according to the present invention is described in further detail below with reference to specific embodiments in conjunction with the accompanying drawings.

Figure 1A:
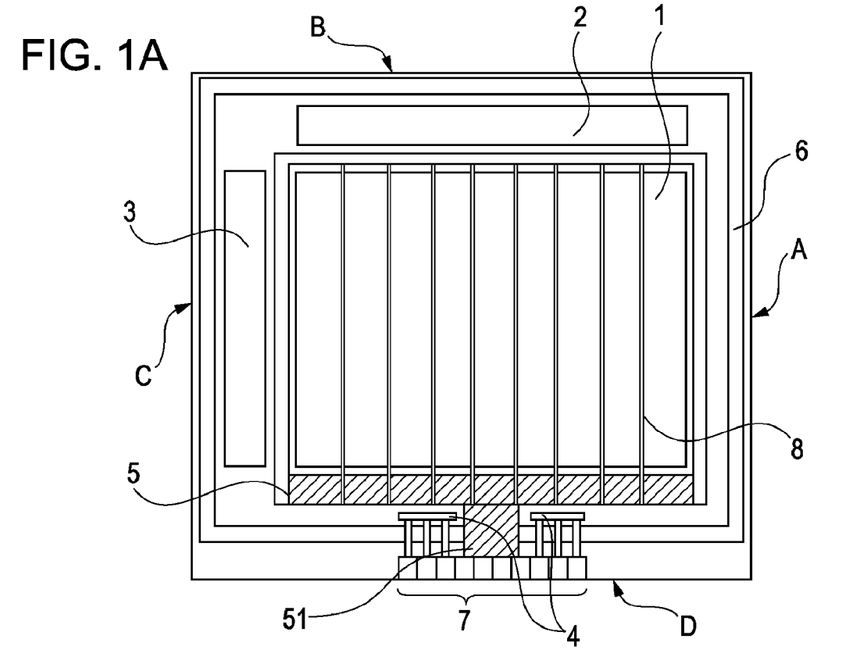
FIGS. 1A and 1B are schematic plan views of a display apparatus according to an embodiment of the present invention.

FIG. 1A illustrates a schematic plan view of a display apparatus according to a first embodiment of the present invention. In FIG. 1A, reference numeral 1 denotes a display part, reference numeral 2 denotes a data line driving circuit, reference numeral 3 denotes a scanning line driving circuit, reference numeral 4 denotes an input circuit, reference numeral 5 denotes a first wiring (common wiring), reference numeral 51 denotes a second wiring (connection wiring), reference numeral 6 denotes an adhesion area, reference numeral 7 denotes a terminal, and reference numeral 8 denotes a third wiring (auxiliary wiring).

The display apparatus shown in FIG. 1A has the display part 1 including a plurality of light emitting elements arranged in the form of a matrix. The display apparatus also has the data line driving circuit 2 and the scanning line driving circuit 3 both formed, on the same substrate, using thin film transistors, wherein the data line driving circuit 2 is disposed on a side B and configured to supply a data signal to data lines connected to the respective light emitting elements, and the scanning line driving circuit 3 is disposed on a side C and configured to supply a control signal to scanning lines connected to the respective light emitting elements. Furthermore, in the present embodiment, terminals 7 via which an image signal, a control signal, and electric power may be supplied and an input circuit 4 configured to convert the input control signal to an operating level of a display panel are disposed on a side D. The display apparatus further has the adhesion area 6 where the substrate on which the display part 1 is formed is bonded to a sealing substrate, and also has the first wiring (common wiring) 5 electrically connected to the second electrode formed continuously across spaces between adjacent light emitting elements and over all light emitting elements. The first wiring 5 is disposed in the periphery outside the display part 1, at least on the side where the terminals 7 are located. The first wiring 5 and the terminals 7 are connected to each other via the second wiring (connection wiring) 51. The third wiring (auxiliary wirings) 8 connected to the second electrode extends in the display part 1. The end of the third wiring 8 is connected to the first wiring 5.

Figure 2:
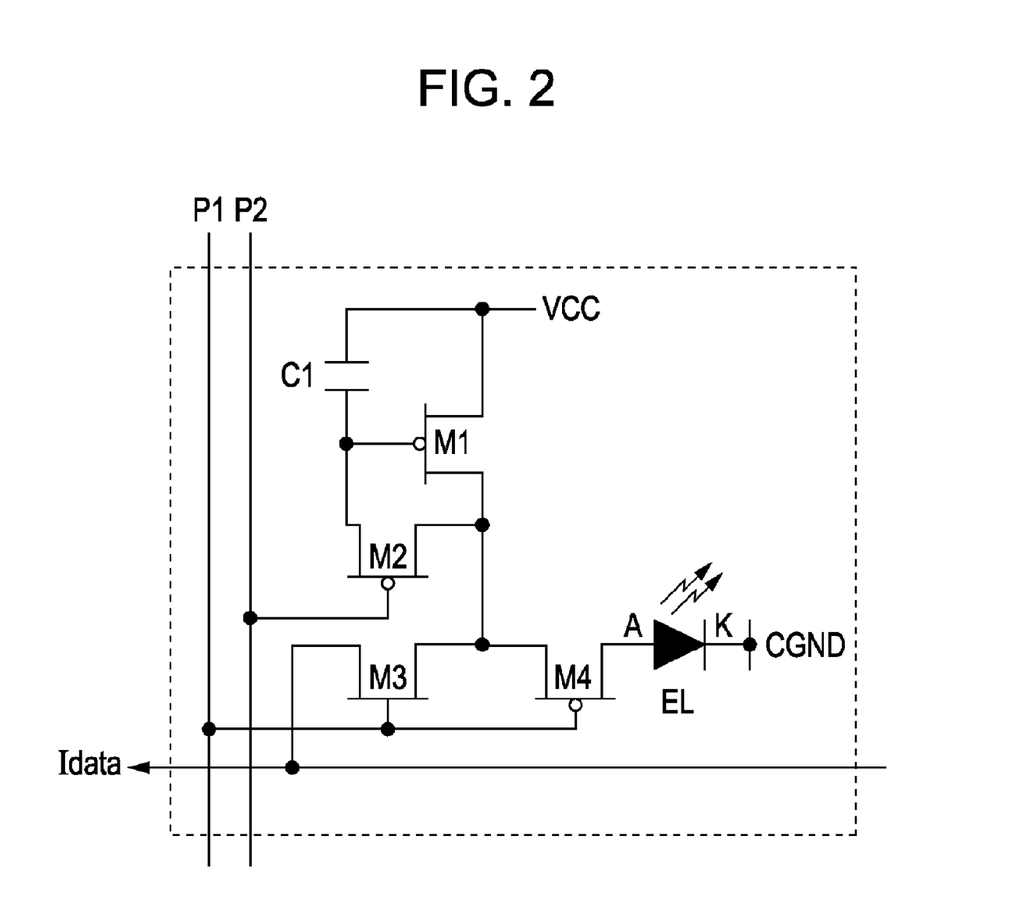
FIG. 2 is a diagram illustrating a current-control pixel circuit including a light emitting element.

FIG. 2 illustrates a current-programming pixel circuit disposed in the display part 1. Control signal lines P1 and P2 are connected to the scanning signal line driving circuit and controlled such that current data is input from data signal lines Idata connected to the data line driving circuit. The first electrode (the anode in the present embodiment) of each light emitting element is connected to a switching thin film transistor M4 which is connected to a power supply line Vcc via a current driving thin film transistor M1. The second electrode of each light emitting element extends across spaces between adjacent light emitting elements so that the second electrodes of the respective light emitting elements are connected together to each other and are connected to a ground potential $C_{GND}$. In FIG. 1A, the second electrode is electrically connected to the third wiring 8 such that the current flowing through each light emitting element mostly flows through the third wiring 8. The current flowing through the third wiring 8 further flows through the second wiring 5 and the third wiring 51 toward the terminals 7. Note that the pixel circuit in the display part 1 is not limited to that described above, but other types of current-programming pixel circuits or voltage-programming pixel circuits configured to input a voltage data signal may also be used.

In FIG. 1A, the first wiring 5 serving as a common wiring is disposed on the side D, where the terminals 7 are located, of the periphery of the display part 1 thereby to reduce the difference in voltage of the second electrode among the plurality of light emitting elements in the display part 1. The first wiring 5 also allows a reduction in heat generation caused by current concentration in the direction toward the terminals 7.

Figure 1B:
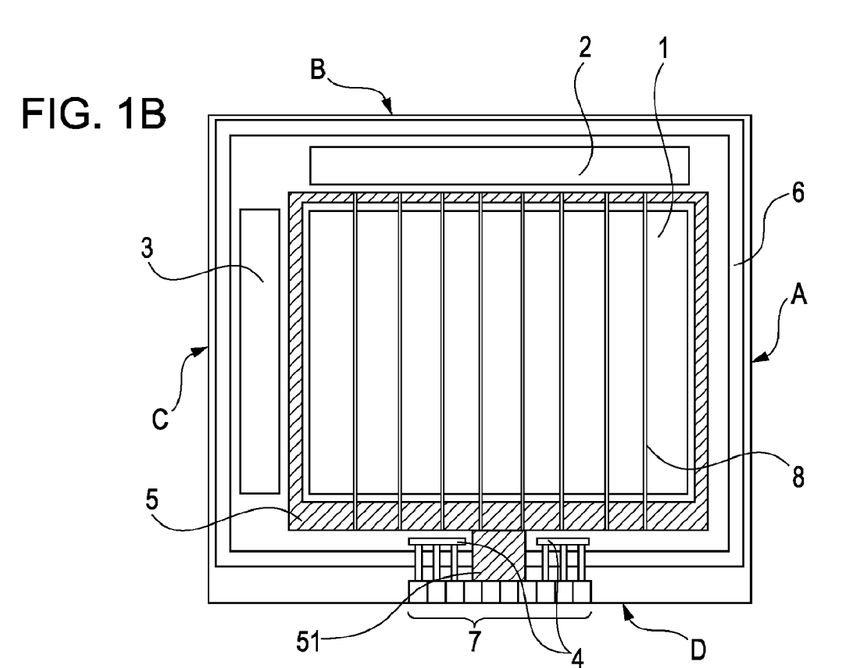

In the example shown in FIG. 1A, the first wiring 5 is disposed only on the side D where the terminals 7 are located. In addition to the first wiring 5 disposed on the side D, an additional common wiring similar to the first wiring 5 may be disposed on at least one of the sides A, B, and C. FIG. 1B illustrates an example of a configuration in which a common wiring is disposed on all sides A, B, C, and D. Even in this configuration, the resistance per unit length of the first wiring 5 defined according to the present invention is given by the resistance per unit length of the wiring located on the side where the terminals 7 are located. The current passing through the second electrode concentrates on the first wiring 5 located on the side D, and thus the current flowing through the first wiring on the sides A, B, and C is smaller than that on the side D. Therefore, the current flowing through the first wiring on the sides A, B, and C can be smaller than that flowing through the third wiring 8. Because the current flowing through the first wiring on the sides A, B, and C is smaller than that on the side D, the width of the first wiring 5 on the sides A, B, and C is allowed to be smaller than that on the side D. Therefore, the frame width on the sides A, B, and C can be smaller than that on the side D.

Figure 3:
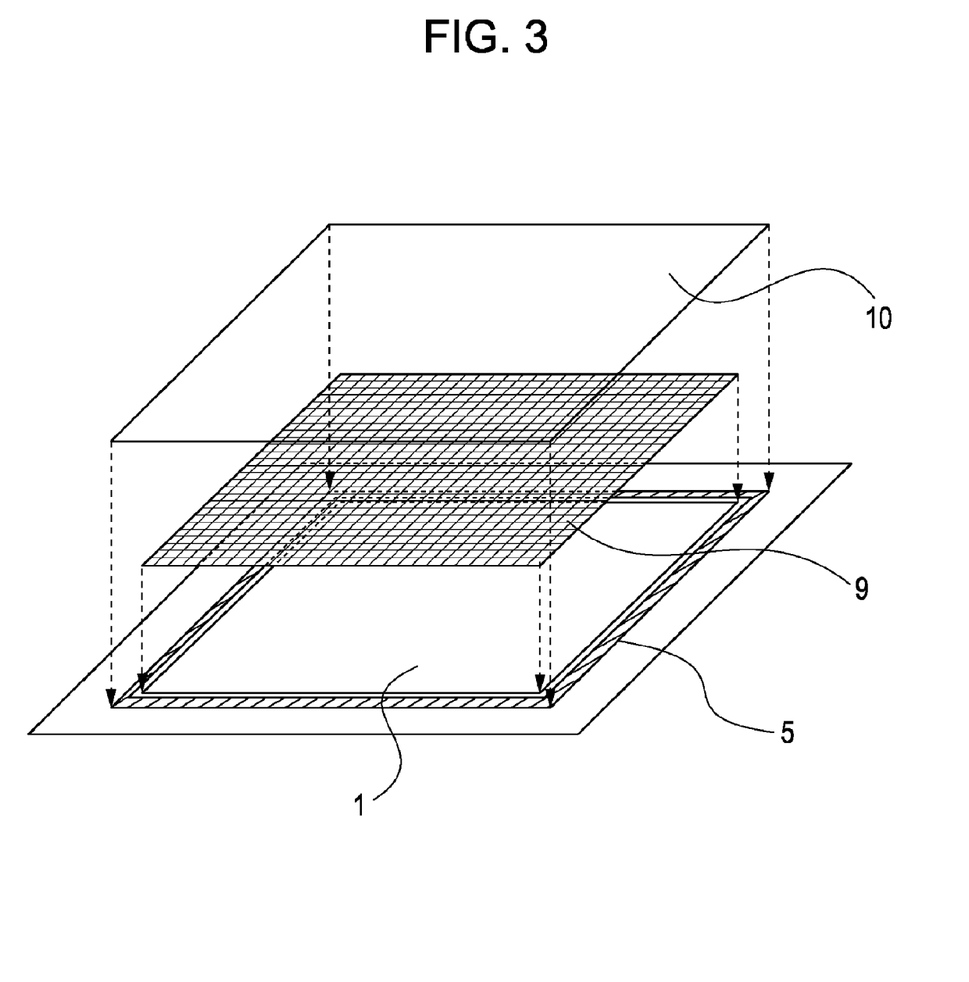
FIG. 3 is a schematic diagram illustrating a 3-dimensional arrangement of light emitting elements and a second electrode.

Next, the connection between the first wiring 5 and each light emitting element is described in detail. FIG. 3 is a schematic diagram illustrating a 3-dimensional arrangement of pixel areas of light emitting elements and the second electrode. In FIG. 3, reference numeral 9 denotes a light emitting layer schematically illustrated for each light emitting element, and reference numeral 10 denotes a second electrode. In the illustration of FIG. 2, the first electrode, the light emitting layer, the second electrode, and the ground potential $C_{GND}$ are all located inside the pixel circuit. The three-dimensional arrangement thereof is described below with reference to FIG. 3. For simplicity, the illustration and the explanation are omitted as to the data line driving circuit 2, the scanning line driving circuit 3, the input circuit 4, the adhesion area 6, and the terminals 7.

In the display part 1 in which the pixel circuits are formed, there are formed first electrodes connected to corresponding thin film transistors. Above the first electrodes, there is formed the light emitting layer 9 partitioned into blocks corresponding to the respective pixels disposed in the array, and the each block of the light emitting layer 9 is connected to the corresponding first electrode. Furthermore, the second electrode 10 is formed above the light emitting layers 9. Note the second electrode 10 is formed so as to extend over the first wiring 5 located in the peripheral area outside the display part 1. In the formation of the second electrode 10, in a case where an insulating layer is formed on the first wiring 5, a contact hole (not shown) is formed in the insulating layer such that the surface of the first wiring 5 is exposed via the insulating layer.

The electrical connection between the second electrode 10 and the first wiring 5 does not necessarily need to be achieved by a direct contact between them, but may be achieved by an indirect connection via a third wiring. The second electrode 10 and the first wiring 5 are electrically connected to each other in the above-described manner, and the second electrode 10 is grounded. Note that the electrical connection between the second electrode 10 and the first wiring 5 does not necessarily need to be made on all sides. Also note that either the first electrode or the second electrode may be the cathode, and the other may be the anode.

The light emitting layer 9 constituting the light emitting element may be formed using either an organic EL material or an inorganic EL material. In the case where an organic EL material is used, heat generation on wirings has a great influence and thus it is advantageous to achieve good uniformity in the heat generation on the wirings. In the case where organic EL elements are used as the light emitting elements, each light emitting element may further include, in addition to the light emitting layer of the organic EL material, a carrier transport layer such as an electron transport layer or a hole transport layer and a carrier injection layer such as an electron injection layer or a hole injection layer.

Light emitted from the light emitting layer 9 of the light emitting element is directed to the outside via either the first electrode or the second electrode. In general, in order to achieve a high integration density of circuit elements such as thin film transistors constituting the pixel circuit formed on the substrate, it is more desirable to employ a configuration (top emission configuration) in which light is emitted to the outside via the second electrode. In this configuration, the second electrode is formed using a transparent electroconductive material such as ITO or IZO or using a film of metal (such as Al, Ag, Pt, etc.) with a thickness selected to be thin enough, such as a few nm to 30 nm, to be sufficiently transparent to light. The second electrode has relatively large resistance that leads to potential differences among the light emitting elements formed in the display part 1. To reduce the potential differences, the first wiring 5 is formed around the display part 1.

The second wiring 51 for the connection between the first wiring 5 and the terminals 7 may be of any form. The greater the distance between the terminals 7 and the first wiring 5, the greater the heat generation. In this regard, it is desirable to minimize the length of the second wiring 51. For example, the second wiring 51 may be formed so as to extend straight between the first wiring 5 and the terminals 7 as shown in FIG. 1A. In order to achieve higher uniformity of the potential of the second electrode of the plurality of light emitting elements in the display part 1, it is desirable to dispose the second wiring 51 in the middle of the display part 1. Furthermore, the first wiring 5 and the second wiring 51 may have a part formed by the same layer. For example, in the TFT process, the first wiring 5 and the second wiring 51 may be formed by a plurality of layers such as a sour/drain layer, a gate layer, etc. The employment of the same layer makes the patterning process simpler, and makes it possible to achieve smoother flowing of current, which allows a reduction in unnecessary heat generation.

The third wirings 8 are auxiliary wirings extending in spaces between adjacent light emitting elements in the display part 1 from the side where the terminals 7 are located to the opposite side. The third wirings 8 allow a reduction in the potential difference of the second electrode among the plurality of light emitting elements in the display part 1, and also allow a reduction in heat generation due to the concentration of current in the direction toward the terminals 7. In the inside of the display part 1, the third wirings 8 are connected to the second electrode, while in the outside of the display part 1, the third wirings 8 are connected directly, or indirectly via the second electrode, to the first wiring 5.

In the inside of the display part 1, the third wirings 8 may be disposed above the second electrode or below the second electrode (on the side of the substrate). In the case where the third wirings 8 are disposed above the second electrode, the third wirings 8 may be formed using a mask processing using evaporation or the like. In the case where the third wirings 8 are disposed below the second electrode, the third wirings 8 may be formed at the same time as the TFTs or the first electrode. In the latter case, the third wiring is connected to the second electrode via a contact hole.

In the outside of the display part 1, the third wirings 8 extend in a direction crossing the first wiring 5. In order to ensure that the third wirings 8 are connected to the first wiring 5 in a highly reliable manner thereby achieving smooth flowing of current, the third wirings 8 may be formed so as to overlap the first wiring 5 over the entire width of the first wiring 5. Furthermore, in order to ensure the overlapping over the entire width regardless of a wiring patterning error, the third wirings 8 may further extend beyond the side end of the first wiring toward the edge of the display apparatus.

Figure 4A:
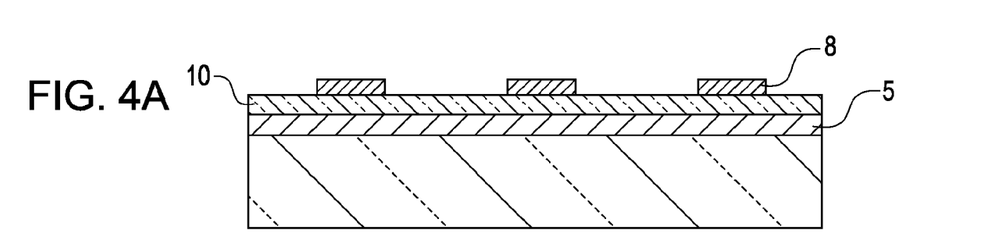
FIGS. 4A to 4C are schematic cross-sectional views illustrating cross-sectional structures including first and third wirings.
Figure 4B:
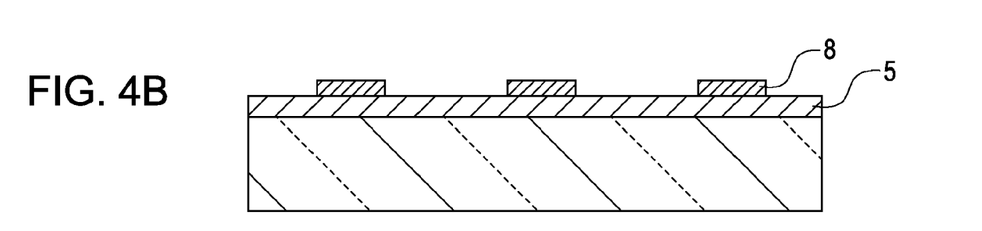
Figure 4C:
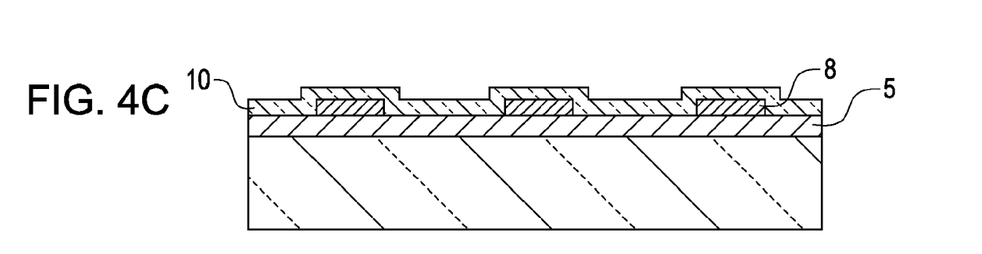

Because a greater concentration of current occurs on the first wiring 5 than on the third wirings 8, it is desirable to form the third wiring 8 over the first wiring 5 formed to be as flat and short as possible thereby minimizing the heat generation. More specifically, for example, the first wiring 5, the third wirings 8, and the second electrode 10 constituting the light emitting element may be formed so as to have one of multi-layer structures shown in FIGS. 4A to 4C. In a case where the second electrode 10 is formed using a transparent electroconductive material, because the second electrode 10 has a greater resistance than the first wiring 5 and the third wirings 8, it is more desirable to directly connect the first wiring 5 to the third wirings 8 in either the manner shown in FIG. 4B or 4C. In the case where the third wirings 8 are disposed above the first wiring 5 in the above-described manner, in order for the first wiring 5 to have a contact, also on its side face, with the third wirings 8, the third wirings 8 may be formed so as to extend across the first wiring 5 and further extend beyond the side end of the first wiring 5 toward the edge of the display apparatus.

Next, an explanation is given below in terms of the relationship of resistance among the first, second and third wirings according to the present embodiment of the invention. The current passing through each light emitting element further flows through the second electrode formed continuously across spaces between adjacent light emitting elements and over all light emitting elements, the third wiring, the first wiring, and the second wiring. In this current flowing process, the current concentrates on the third, first, and second wirings. Thus among the first, second, and third wirings, the current is smallest in the third wiring 8 formed in the display part 1, and the current increases in order from the first wiring to the second wiring. In the present embodiment of the invention, in view of the above, the resistances per unit length, $R_1$, $R_2$, and $R_3$, for the first, second, and third wirings are set such that $R_2<R_1<R_3$. By properly setting the resistance per unit length in the above-described manner depending on the current flowing through the wirings, it is possible to achieve better uniformity of heat generation on the wirings connected to the electrode provided in common for the elements in the display part and thus it is possible to achieve better uniformity of influence of the heat generation on the light emitting elements thereby achieving better uniformity in displaying image information in the display part over a long period.

Many methods may be used to set the resistance per unit length to different values depending on the sides. For example, the resistivity may be changed by adjusting the width and/or the thickness of each wiring and/or by properly selecting the resistivity of the material of the wiring. More specifically, the width of the common wiring may be set such that the wiring has a greater width on the side where the current flowing through the wiring is greatest than on the other sides. The thickness of the wiring may be set such that the wiring has a greater thickness on the side where the current flowing through the wiring is greatest than on the other sides. The resistivity of the wiring may be set such that the wiring has a smaller resistivity on the side where the current flowing through the wiring is greatest than on the other sides. Note that two or more parameters including the width and thickness of the wirings, the resistivity of the materials wirings, etc. may be set to have different proper values.

Furthermore, to reduce the heat generation on the wirings having a large current flowing therethrough, the lengths, $L_1$, $L_2$, and $L_3$, of the first, second, and third wirings may be set such that $L_3>L_1>L_2$ as shown in FIG. 1A. The arrangement described above makes it possible to effectively reduce the total heat generation of the display apparatus. That is, it becomes possible not only to reduce the influence of the heat generation on the light emitting elements but also to reduce the power consumption of the display apparatus.

In the display apparatus according to the present embodiment of the invention, as shown in FIG. 1A, the data line driving circuit and the scanning line driving circuit may be disposed such that one of them is located on a side opposite to the side where the terminals are formed, and the other one is located on a side adjacent to the side where the terminals are formed. It is desirable that data lines be disposed so as to extend in a direction crossing a direction in which scanning lines extend. Thus, if either the data line driving circuit or the scanning line driving circuit is disposed on the side where the terminals 7 are formed, the result is an increase in the width of the first wiring or in the length of the second wiring by an amount corresponding to the width of the driving circuit, which results in an increase in heat generation.

In the present embodiment of the invention, by way of example, the data line driving circuit 2, the scanning signal line driving circuit 3, and the input circuit 4 are formed using thin film transistors on the same substrate. However, they may be configured in a different manner. For example, alternatively, the circuit functions may be implemented using a driver IC formed on a single-crystal Si, and signals may be input from the outside of the display apparatus via the terminals. Still alternatively, the driver IC may be mounted on a substrate in the form of, for example, COG so that the circuit functions are realized on the substrate. In this case, the data line driving circuit 2 and the scanning line driving circuit 3 may be removed from the sides B and C, respectively, and the driver IC may be disposed in a space at the side A close to the terminals 7 thereby achieving a further reduction in the frame width of the display apparatus.

Figure 5A:
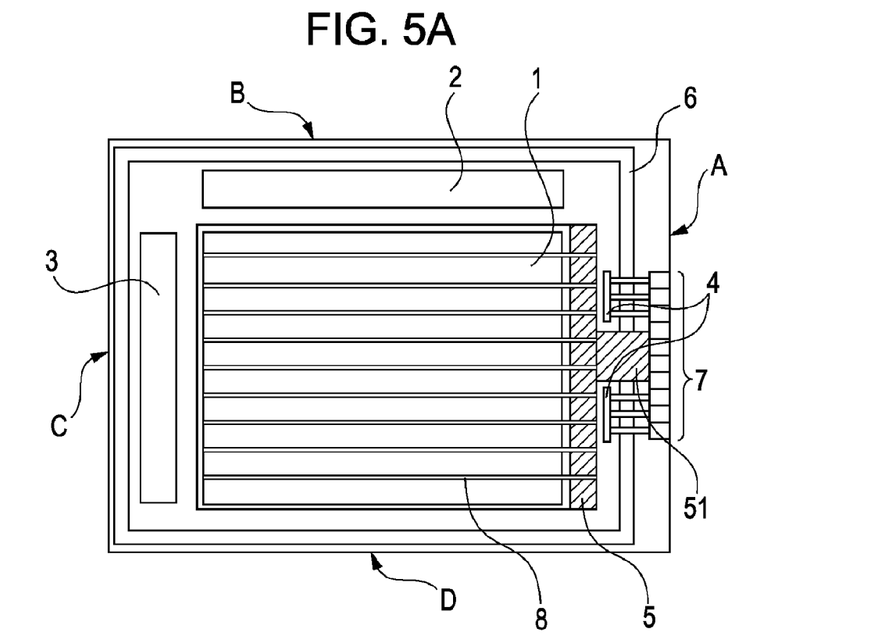
FIGS. 5A and 5B are schematic plan views of a display apparatus according to an embodiment of the present invention.

FIG. 5A illustrates a schematic plan view of a display apparatus according to a second embodiment of the present invention. The second embodiment is different from the first embodiment as specifically described below.

In the first embodiment described above, the terminals 7 are disposed on a longer side of the rectangular display part 1. In the second embodiment, in contrast, the terminals 7 are disposed on a shorter side of the rectangular display part 1.

In the case where the current concentration in the display part 1 occurs in a direction along the longer side of the panel, a greater voltage difference distribution occurs in the display part compared with the configuration in which the terminals 7 are disposed on a longer side of the panel. By disposing auxiliary wirings in a direction along the longer sides of the panel, it is possible to reduce the voltage difference distribution and thus it is possible to improve the image quality.

Even in this case where the terminals 7 are formed on the shorter side, among the currents flowing through the first, second, and third wirings, the current flowing through third wiring is the smallest, and the current increases in the order of the first wiring to the second wiring. Therefore, by setting the resistances $R_1$, $R_2$, and $R_3$ per unit length of the first, second, and third wirings such that $R_2<R_1<R_3$, it is possible to achieve advantages similar to those achieved in the first embodiment.

Figure 5B:
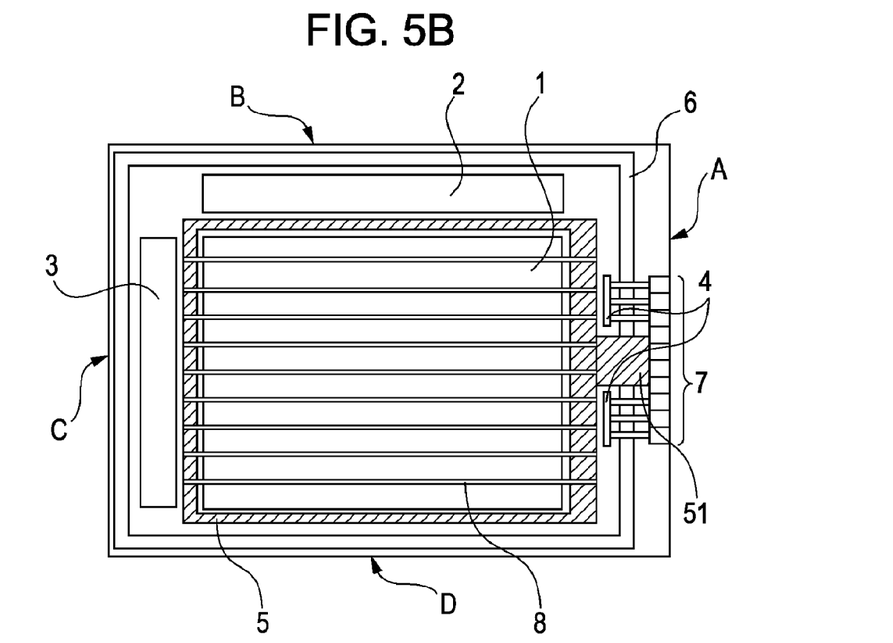

Furthermore, as in the first embodiment, the common wiring may be disposed on all sides A, B, C, and D as shown in FIG. 5B.

In a case where a display apparatus is disposed in a portable electronic device such as a mobile phone or a compact camera, it is required to minimize the frame width along the longer sides of the display part, and thus an external connection terminal for connection with a part outside the panel is usually disposed on a shorter side. In the present embodiment, in view of the above, the terminals 7 are disposed on a shorter side of the rectangular display part 1.

In the examples shown in FIGS. 5A and 5B, the resistance per unit length of each wiring is adjusted by the width of the wiring. Alternatively, as in the first embodiment, the resistance may be adjusted by various methods, for example, by properly selecting the thickness of the wiring or the resistivity of the wiring.

Figure 6A:
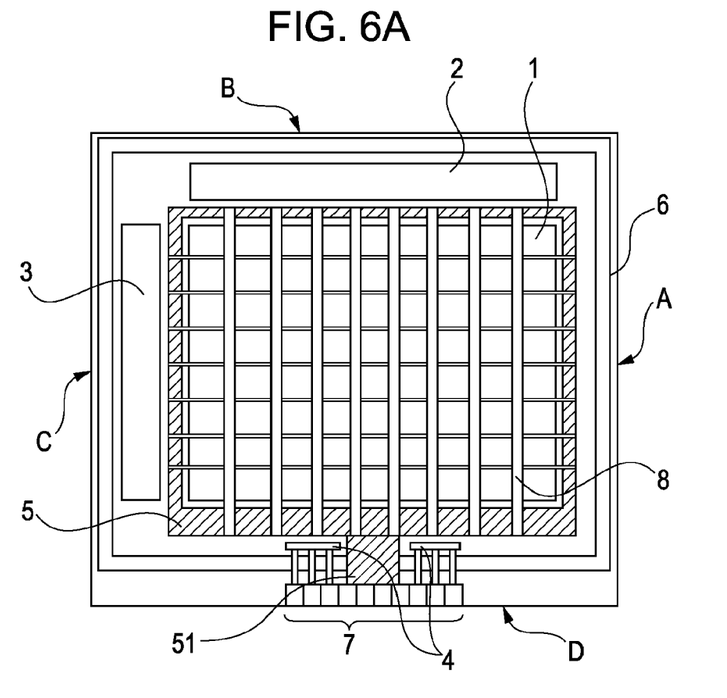
FIGS. 6A and 6B are schematic plan views of a display apparatus according to an embodiment of the present invention.

FIG. 6A illustrates a schematic plan view of a display apparatus according to a third embodiment of the present invention. The third embodiment is different from the first embodiment as specifically described below.

In the first embodiment described above, the third wiring is disposed in the display part so as to extend between the long side where the terminals are located and the opposite side. In the third embodiment, a fourth wiring is additionally disposed so as to extend between two sides adjacent to the long side where the terminals are located. That is, in the display apparatus according to the present embodiment, the auxiliary wiring is disposed in the form of a matrix in the display part. This allows a further reduction in potential difference of the second electrode among a plurality of light emitting elements in the display part, and thus it becomes possible to achieve still better uniformity in the heat generation within the display part 1.

Also in the present embodiment in which the auxiliary wiring is disposed in the form of a matrix, the resistance values $R_1$, $R_2$, and $R_3$ of the first, second, and third wirings are set, as in the first embodiment, such that $R_2<R_1<R_3$.

The third wiring extending in a direction toward the terminals has a greater current than the fourth wiring. Therefore, it is more desirable to set the resistance values such that the third wiring has smaller resistance per unit length than the fourth wiring thereby achieving a better uniformity in heat generation within the display part 1.

The resistance per unit length for the third and fourth wirings may be adjusted by various methods, for example, by properly selecting the width and/or the thickness of the wirings and/or the resistivity of the materials of the wirings.

In the case where the resistance of the wiring is adjusted by the width, that is, in the case where, for example, the width of the third wiring is set to be greater than that of the fourth wiring 8, the ratio (aperture ratio) of the total area of light emitting elements to the area of the display part may be taken into account in the determination of the width of each wiring, because the disposed auxiliary wirings in the display part can cause a reduction in the aperture ratio.

Figure 6B:
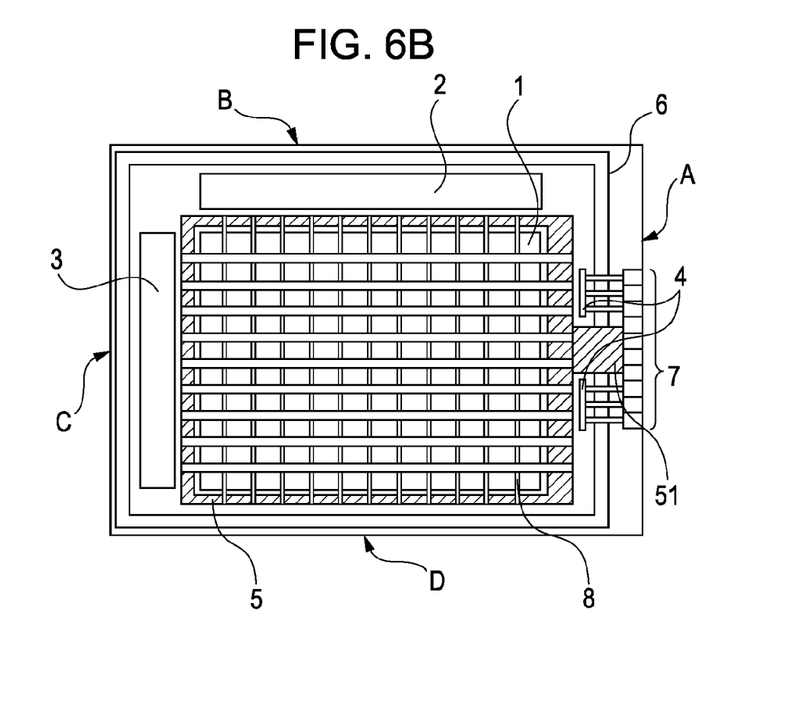

In the configuration in which the auxiliary wiring is disposed in the form of a matrix, the terminals 7 may be disposed on a shorter side of the rectangular display part 1 as shown in FIG. 6B.

It is possible to form an information display apparatus using a display apparatus according to one of the first to third embodiments described above. The information display apparatus may be in any one form including a mobile phone, a portable computer, a digital still camera, a video camera, a television set, a portable music player, a navigation system, and a PC monitor. The information display apparatus may be formed to implement two or more of the functions described above.

Figure 7:
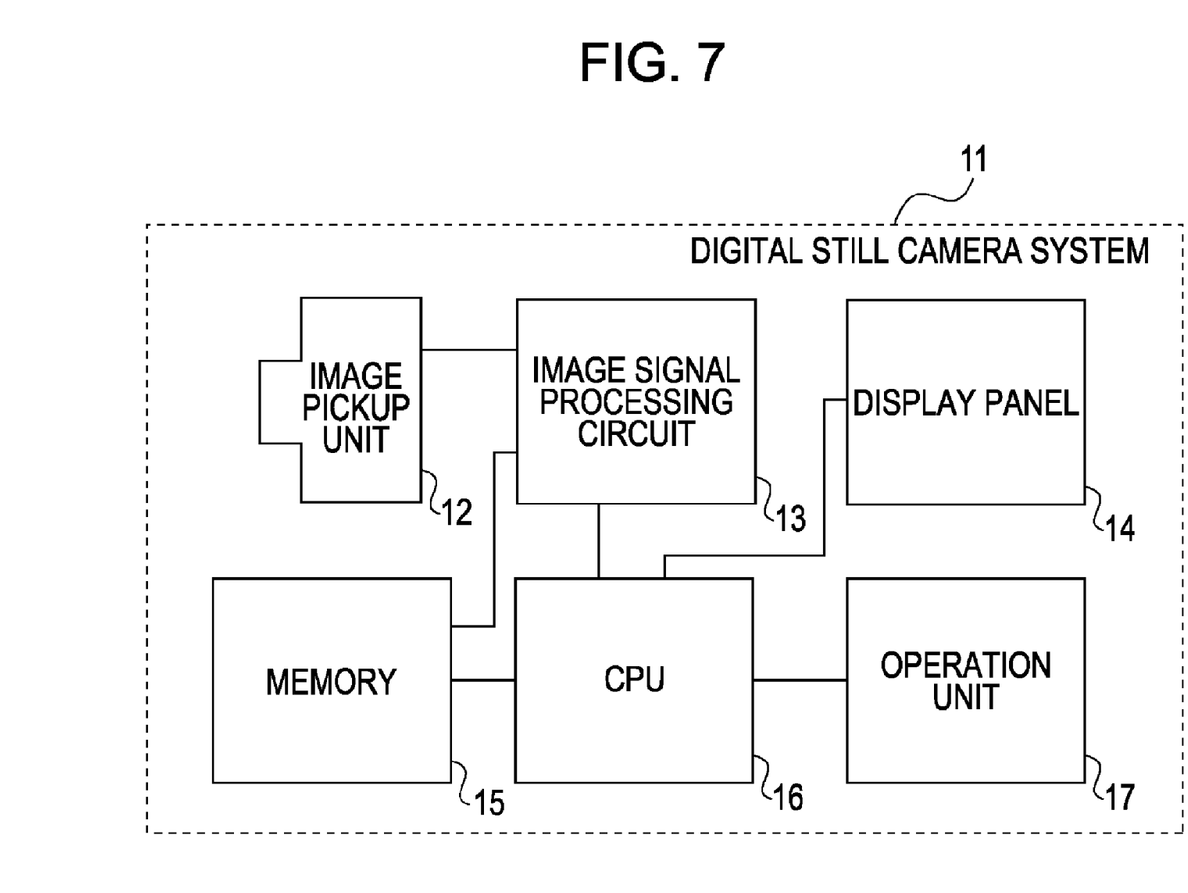
FIG. 7 is a block diagram illustrating an overall structure of a digital still camera system according to an embodiment of the present invention.

FIG. 7 is a block diagram illustrating an example of a digital still camera system. Reference numeral 11 denotes the digital still camera system, reference numeral 12 denotes an image pickup unit, reference numeral 13 denotes an image signal processing circuit, reference numeral 14 denotes a display apparatus in the form of a display panel, reference numeral 15 denotes a memory, reference numeral 16 denotes a CPU, and reference numeral 17 denotes an operation unit. An image taken by the image pickup unit 12 or an image stored in the memory 15 is subjected to signal processing performed by the image signal processing circuit 11, and a resultant image is displayed on the display panel 14. The CPU 16 controls the image pickup unit 12, the memory 15, the image signal processing circuit 13, and other parts in accordance with an input given via the operation unit 17 to take an image, store the taken image, and play back and display the stored image.

The display apparatus may also be used as a display part of various other types of electronic devices.

In the first to fourth embodiments described above, by way of example, the EL element is used in the display apparatus. Note that the present invention is also applicable to other types of display apparatuses, for example, a current-driven display apparatus such as a PDP (Plasma Display Panel) or a FED (Field Emission Display).

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Patent Application No. 2008-129583 filed May 16, 2008 and No. 2009-071998 filed Mar. 24, 2009, which are hereby incorporated by reference herein in their entirety.

What is claimed is:

1. A display apparatus comprising:
   a substrate;
   a display part disposed on the substrate, the display part including a plurality of light emitting elements, the plurality of light emitting elements each including a first electrode, a light emitting layer, and a second electrode that are formed on the substrate in order from bottom to top of the first electrode, the light emitting layer, the second electrode;
   a terminal disposed on one side of a periphery of the display part;
   a first wiring disposed on the one side of the periphery of the display part;
   a second wiring connecting the terminal to the first wiring; and
   a third wiring disposed in the display part, the third wiring extending between the one side and an opposite side, the third wiring being connected to the first wiring,
   wherein the second electrode is connected to the third wiring, and wherein the first, second, and third wirings have resistances per unit length, $R_1$, $R_2$, and $R_3$, respectively, which are set such that $R_2<R_1<R_3$.

2. The display apparatus according to claim 1, wherein the third wiring overlaps the first wiring over an entire width of the first wiring.

3. The display apparatus according to claim 1, wherein the third wiring extends across an entire width of the first wiring and further extends toward an edge of the display apparatus.

4. The display apparatus according to claim 3, wherein the third wiring is located above the first wiring.

5. The display apparatus according to claim 1, further comprising:
a fourth wiring disposed in the display part between two sides of the display part and adjacent to the side where the terminal is located.

6. The display apparatus according to claim 5, wherein the resistance per unit length of the third wiring is smaller than the resistance per unit length of the fourth wiring.

7. The display apparatus according to claim 1, further comprising:
a data line driving circuit configured to supply a data signal to a data line connected to each light emitting element; and
a scanning line driving circuit configured to supply a scanning signal to a scanning line connected to each light emitting element,
the data line driving circuit and the scanning line driving circuit being disposed on a periphery of the display part,
one of the data line driving circuit and the scanning line driving circuit being disposed on a side opposite to the side where the terminal is disposed,
the other one of the data line driving circuit and the scanning line driving circuit being disposed on a side adjacent to the side where the terminal is disposed.

8. The display apparatus according to claim 1, wherein:
the display part is rectangular in shape;
the terminal, the first wiring, and the second wiring are disposed on a shorter side of the display part; and
the first, second, and third wirings have lengths $L_1$, $L_2$, and $L_3$, respectively, which are set such that $L_3 > L_1 > L_2$.

9. The display apparatus according to claim 1, wherein the second electrode is formed continuously over the plurality of light emitting elements and extends across spaces between adjacent light emitting elements.

10. A display apparatus comprising:
a substrate;
a display part disposed on the substrate, the display part including a plurality of light emitting elements, the plurality of light emitting elements each including a first electrode, a light emitting layer, and a second electrode that are formed on the substrate in order of the first electrode, the light emitting layer, the second electrode;
a terminal disposed on one side of a periphery of the display part;
a first wiring disposed on the one side of the periphery of the display part;
a second wiring connecting the terminal to the first wiring; and
a third wiring disposed in the display part, the third wiring extending between the one side and an opposite side, the third wiring being connected to the first wiring,
wherein the second electrode is connected to the third wiring, and wherein the first, second, and third wirings have resistances per unit length, $R_1$, $R_2$, and $R_3$, respectively, which are set such that $R_2 < R_1 < R_3$.

* * * * *